(12) United States Patent
Hoefler

(10) Patent No.: US 7,804,701 B2
(45) Date of Patent: Sep. 28, 2010

(54) METHOD OF PROGRAMMING A MEMORY HAVING ELECTRICALLY PROGRAMMABLE FUSES

(75) Inventor: Alexander Hoefler, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 301 days.

(21) Appl. No.: 12/040,407

(22) Filed: Feb. 29, 2008

(65) Prior Publication Data

US 2009/0219747 A1 Sep. 3, 2009

(51) Int. Cl.
*G11C 17/00* (2006.01)
(52) U.S. Cl. .................. 365/96; 365/225.7; 365/185.18; 365/27; 365/94
(58) Field of Classification Search .................... 365/96, 365/27, 225.7, 185.18, 94
See application file for complete search history.

(56) References Cited

U.S. PATENT DOCUMENTS 4,605,872 A * 8/1986 Rung ......................... 327/525
5,299,150 A * 3/1994 Galbraith et al. ............... 365/94
5,552,338 A * 9/1996 Kang ......................... 438/215
5,661,323 A 8/1997 Choi et al.

* cited by examiner

*Primary Examiner*—Pho M Luu
*Assistant Examiner*—Tha-O Bui
(74) *Attorney, Agent, or Firm*—James L. Clingan, Jr; Robert L. King

(57) ABSTRACT

An array of memory cells is arranged in a plurality of columns and rows, each of the memory cells including a programmable fuse connected to a predetermined bit line and in series with a select transistor. The select transistor has a first current electrode connected to a reference voltage terminal, a control electrode connected to a predetermined word line, and a second current electrode connected to the programmable fuse. The select transistor further has a semiconductor body adjacent to which the first current electrode and the second current electrode are located. These electrodes are separated by a channel. A signal terminal that is connected to the semiconductor body receives an input signal to forward bias the channel to the first current electrode during programming of the programmable fuse to increase a programming current of the programmable fuse.

16 Claims, 2 Drawing Sheets

METHOD OF PROGRAMMING A MEMORY HAVING ELECTRICALLY PROGRAMMABLE FUSES

BACKGROUND

1. Field

This disclosure relates generally to memories, and more specifically, to memories having electrically programmable fuses.

2. Related Art

Fuses have been used successfully for many years in implementing a variety of functions that require programming just once. One example is implementing redundancy in a memory. Another example is for providing information about the particular integrated circuit such as lot number and when manufactured. Another use is at a point of sale programming for a particular user such as for a purchaser of a mobile phone or a change in service provider. Fuse programming is one type of the general category known as one time programmable (OTP) memories. An OTP memory may use floating gate technology. A disadvantage of floating gate memories is that they require significant special processing from that required for single gate transistors that are used for logic, buffering, and other uses. Fuses generally require significantly more space than floating gate memories so are commonly used when the amount of memory that is required is relatively small, such as for the uses described above. Laser programmable fuses of course require a laser and the extra processing required for the laser programming function. Additionally the fuse has to be in a position where it can be blown by an overhead laser. One issue with electrically programmable fuses is that they require significant current in order to be programmed. Thus there are transistors that must be of sufficient size to handle these relatively high currents. Further, the voltages applied to the transistors, in order to pass these high currents, generally need to be higher than the power supply voltage used to power the logic transistors. Also, electrically programmable fuses that are on the same word line or bit line as the one being programmed are susceptible to having their logic state changed. This is sometimes called write disturb, which is a known problem but which also can be a difficult problem to overcome.

Thus, there is a need for a method for programming electrically programmable fuses that improve on the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A memory having electrically programmable fuses has select transistors that are used for selecting a memory cell for either reading or programming. For reading the transistors are biased as typical logic transistors. For the higher currents required for programming the select transistors are biased to a higher current carrying capability. This higher current carrying capability is achieved by providing a bias on the body of transistors that is limited by a parasitic bipolar transistor formed by the channel as the base, the source as the emitter, and the drain as the collector. The bias is current limited so that parasitic transistor carries a very small percentage of the current required for programming the fuses. The result is select transistors that have higher current carrying capability for a given size than would normally be available. One way this may be beneficial is that the programming current can be increased to improve programming margin. Another way is that the size of the transistors may be reduced to achieve the same current. Yet another way is to reduce the programming voltage while keeping the current the same. This can be used to save space and thus reduce cost. This is better understood by reference to the drawings and the following description.

Figure 1:
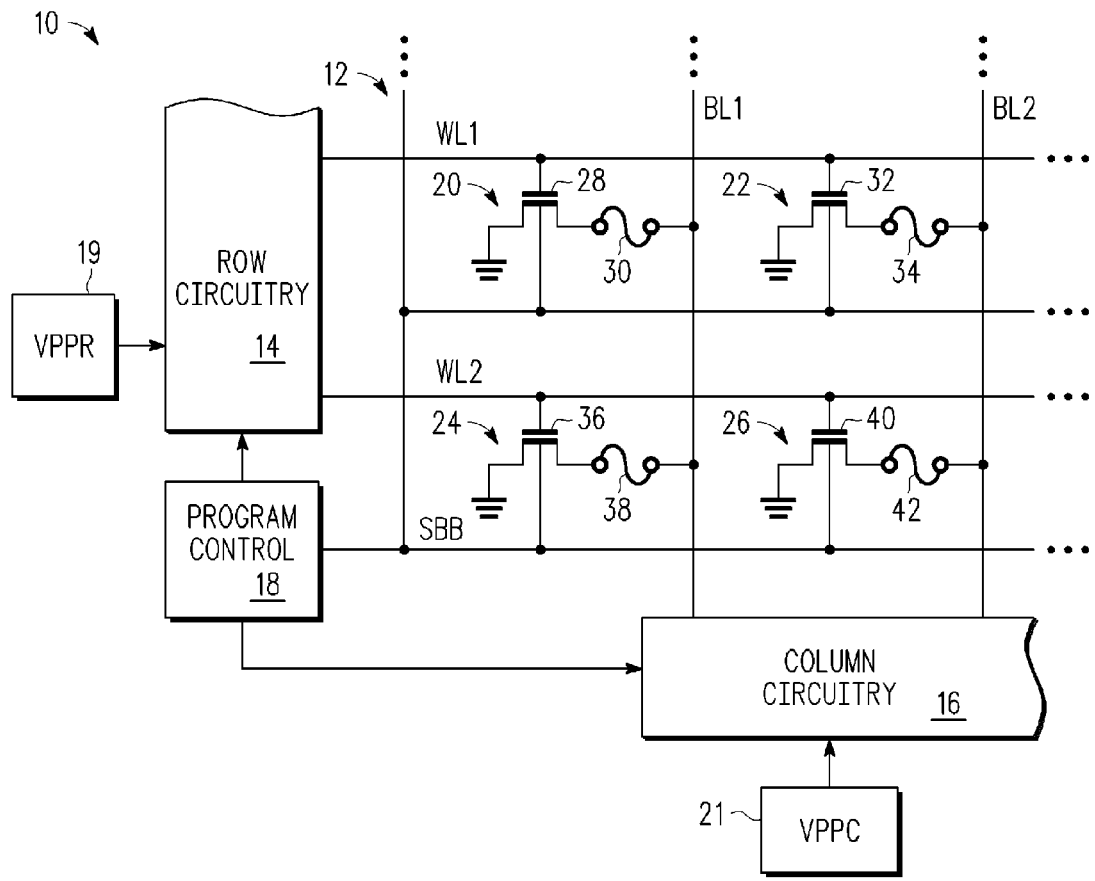
FIG. 1 is a circuit diagram of a memory having electrically programmable fuses according to an embodiment.

Shown in FIG. 1 is a memory 10 comprising an array 12, row circuitry 14, column circuitry 16, program control 18, a high voltage generator 19, and a high voltage generator 21. Array 12 comprises a word line WL1, a word line WL2, a bit line BL1, a bit line BL2, a memory cell 20, a memory cell 22, a memory cell 24, a memory cell 26, as well as other memory cells not shown. Memory cell 20 comprises an N channel transistor 28 and an electrically programmable fuse 30. Memory cell 22 comprises an N channel transistor 32 and a fuse 34. Memory cell 24 comprises an N channel transistor 36 and a fuse 38. Memory cell 26 comprises an N channel transistor 40 and a fuse 42. Row circuitry 14 is coupled to word lines WL1 and WL2 as well as other word lines not shown. Column circuitry 16 is coupled to bit lines BL1 and BL2 as well as other bit lines not shown. Program control 18 is coupled to row circuitry 14, column circuitry 16, and memory cells 20, 22, 24, and 26 as well as other memory cells not shown. High voltage circuit 19 provides a high voltage VPPR for use as a high voltage on a word line selected by row circuitry 14 during a programming mode. Similarly, high voltage circuit 21 provides a high voltage VPPC for use as a high voltage on a bit line selected by column circuitry 16 during the programming mode. Row circuitry 14 enables a selected word line, such as one of word lines WL1 and WL2, with VPPC a normal power supply voltage VDD during a read mode. Column circuitry 16 reads data provided on a selected bit line, such as one of bit lines BL1 and BL2, in the read mode. Column circuitry 16 may also include precharge circuitry. Fuses 30, 34, 38, and 42 may be made of polysilicon or another fusible material. Preferably the fusible material for fuses 30, 34, 38, and 42 is the same as used for transistors gates. Silicided polysilicon is another example of a transistor gate material. Fuses 30, 34, 38, and 42 do not need to be completely opened when programmed in order to have a detectable difference between the programmed state and the original unprogrammed state. As is typical of memories, word lines and bit lines that are selected are predetermined to be selected and the selection is communicated through row and column addresses.

Transistor 28 has a gate connected to word line WL1, a source connected to a reference power supply terminal, and a drain. The reference power supply terminal in this example is ground but could be different than ground. Fuse 30 has a first terminal connected to the drain of transistor 28 and a second terminal connected to bit line BL1. Transistor 32 has a gate connected to word line WL1, a source connected to ground, and a drain. Fuse 34 has a first terminal connected to the drain of transistor 32 and a second terminal connected to bit line BL2. Transistor 36 has a gate connected to word line WL2, a source connected to ground, and a drain. Fuse 38 has a first terminal connected to the drain of transistor 36 and a second terminal connected to bit line BL1. Transistor 40 has a gate connected to word line WL2, a source connected to ground, and a drain. Fuse 42 has a first terminal connected to the drain of transistor 40 and a second terminal connected to bit line BL2. Each of transistors 28, 32, 36, and 40 have a channel in the body, and the body may be biased to a desired voltage for adjusting performance. The bias is commonly called a body bias. In the case of the substrate being a bulk semiconductor such as silicon, the bias is applied per well. In the case of a semiconductor on insulator (SOI) substrate the body bias, if any, is applied on a per transistor basis. In either case there is a contact to the semiconductor region in which the channel is formed which, in this example, this region will be called the body whether it is for a transistor formed using a bulk semiconductor substrate or an SOI substrate. Program control 18 provides a switchable body bias SBB to the bodies of transistors 28, 32, 36, and 40. Switchable body bias SBB may be ground (0 V) during the read mode and provide a current that results in a voltage of about 0.7 volt in the program mode. Program control 18 directs the program and read modes through row circuitry 14 and column circuitry 16.

Figure 2:
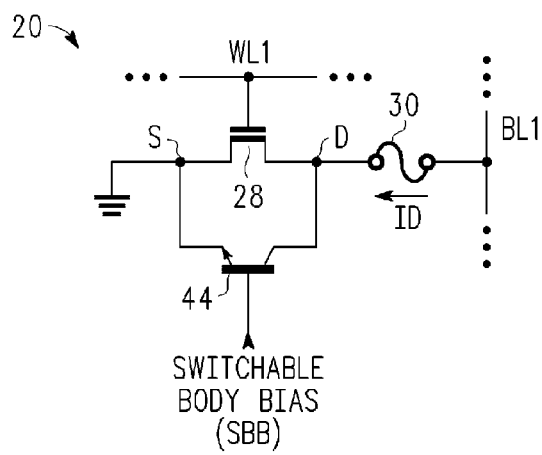
FIG. 2 is a circuit diagram of a portion of the memory of FIG. 1 in more detail.

Shown in FIG. 2 is a more detailed diagram of memory cell 20 showing a parasitic NPN transistor 44 that naturally occurs with an N channel transistor. In the case of N channel transistor 28, the drain (D) is N type, the source (S) is N type, and the channel, which is between the source and drain, is P type. Parasitic NPN transistor 44 thus results from the P type channel being the base between the N type source as the emitter and the N type drain as the collector. Transistor 44, being implemented in silicon, will become conductive when the base exceeds the emitter by about 0.7 volt but the voltage is also clamped at near 0.7 volt due to the forward biased PN junction of the channel (base) to source (emitter). The channel of transistor 28, and thus the base of transistor 44, receive switchable body bias SBB.

For programming memory cell 20, fuse 30 is to have its resistance increased from its original resistance by a sufficient margin. It is not necessary that fuse 30 become an open circuit in order for column circuitry 16 to be able to read fuse 30, after programming, as a different logic state from the original unprogrammed resistance. Programming is achieved by row circuitry 14 applying high voltage VPPR to word line WL1, column circuitry applying high voltage VPPC to bit line BL1, and program control 18 applying a current to the body of transistor 28 and thus the base of transistor 44. This current is controlled so that collector to emitter current is significantly less than what is required to program fuse 30. This current is enough to bring the body voltage to 0.7 volt. Raising the body voltage lowers the threshold voltage of transistor 28. For a given value of high voltage VCCR, the drain current is increased. The size of transistor 28 is chosen relative to the resistance of fuse 30 so that transistor 28 is in saturation. In saturation, the drain current is proportional to the square of the gate to source voltage minus the threshold voltage. Exemplary voltages are high voltage VPPR being 1.5 volt, the threshold voltage with switchable body bias SBB at ground is 0.4 volt, and the threshold voltage with switchable body bias SBB at 0.7 volt is about 0.2 volt. For the case of switchable body bias SBB at ground, the result is 1.5 minus 0.4 squared which is 1.1 squared which is 1.11. For the case of switchable body bias SBB at 0.7 volt, the result is 1.5 minus 0.2 squared which is 1.3 squared which is 1.69. This shows a 40% greater current for the case of switchable body bias SBB being at 0.7 volt. Fuse 38, which receives VPPC during the programming of fuse 30, is not programmed because word line WL2 is kept at a logic low so that transistor 36 does not become conductive and thus programming current does not pass through fuse 38. The programming voltage of VPPC is applied to both fuses 30 and 38 but only fuse 30 receives the programming current.

For the read case, normal logic voltages are used. In this example, a logic high of about 1.0 volt would be applied to the word line selected by row circuitry 14. Column circuitry 16 reads the state of the memory cell along the enabled word line that is coupled to the selected bit line.

Figure 3:
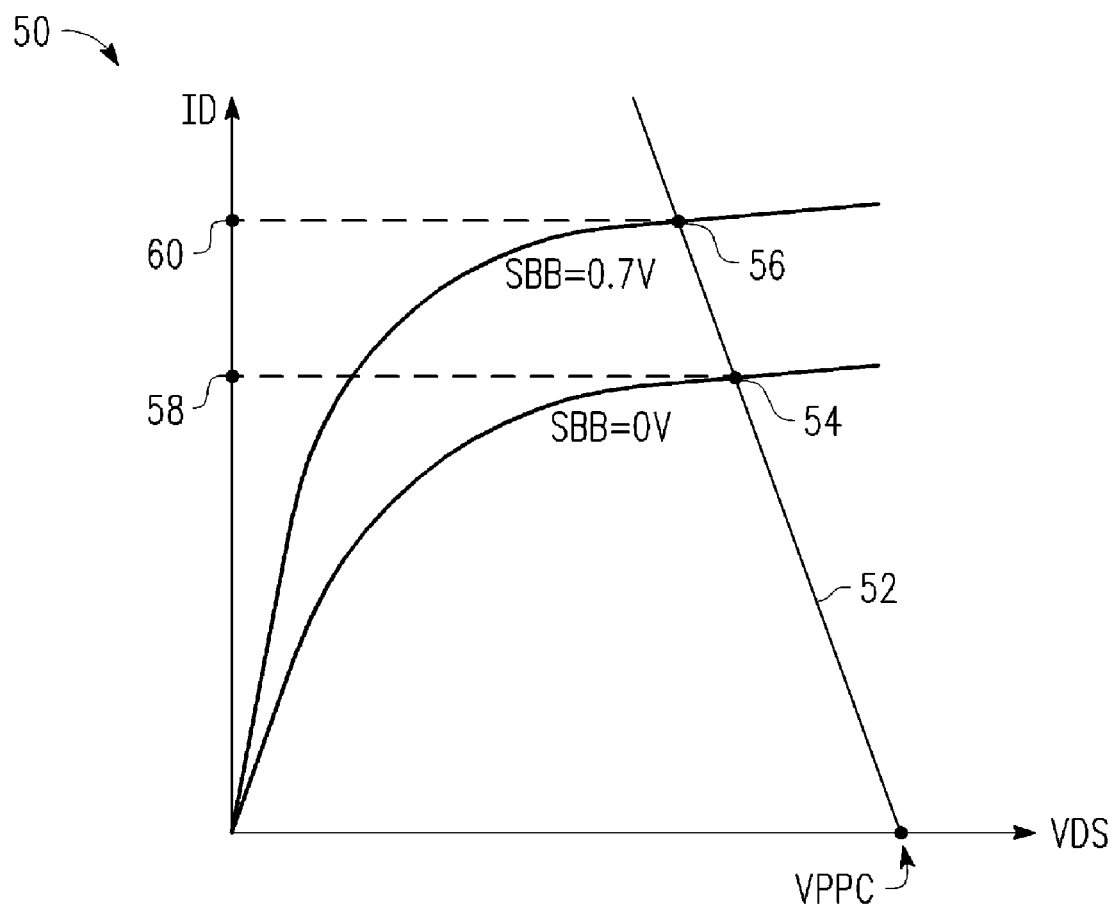
FIG. 3 is a graph useful in understanding the operation of the memory of FIG. 1.

Shown in FIG. 3 is a graph 50 of two curves for transistor 28 showing the drain current (ID) as a function of the drain to source voltage (VDS) for the switchable body bias SBB being ground and 0.7 volt. Also shown is a load line 52; the negative slope of which is the unprogrammed resistance of fuse 30. The drain current through fuse 30 is zero when transistor 28 is non-conductive. Thus load line 52 is at zero current in graph 50 when VDS, the voltage across transistor 28, has all of the voltage applied at bit line BL1. The voltage applied at BL1 is voltage VPPC, so load line 52 is at zero current when VDS is at voltage VPPC. In such case there is no voltage drop across fuse 30 so there is no current. Load line 52 intersects the two curves at point 54 and point 56. These are the points that show what the current will be through fuse 30 for the two conditions shown. This is shown as currents 58 and 60. Current 60 exceeds current 58 by about 40% for the example of a reduction of threshold voltage from 0.4 to 0.2 volt with the gate to source voltage at 1.5 volt. This increased current carrying capability for a given bias conditions due to increase the body voltage can be used beneficially in several ways. One way is simply to provide more current to improve programming margin. Another way is to reduce the gate to source voltage (VPPR) and/or the bit line voltage (VPPC). Another way is to reduce the size of transistor 28.

The current provided when switchable body bias SBB is at 0.7 volt is limited to ensure a memory cell that is to be left in its original resistance does not get programmed. For example, all of the memory cells, in this example, that are on the selected column have a voltage applied across the drain and source and thus across the collector and emitter. The gate is receiving current so the transistor is conductive. The current though, is predictable within a sufficient range to ensure that the parasitic transistor does not draw enough current to program the fuse to which it is connected. For example, if memory cell 20 is not to be programmed but is in the selected column, bit line BL1 will be at high voltage VPPC, SBB will be at 0.7 volt for example, and parasitic transistor 44 will be conductive. The current into the base, however, is limited so that the current through transistor 44 is well below a value that will begin to program fuse 30.

In an alternative in which there may be very few memory cells, it may be advantageous to selectively apply the base current so that only the memory cells that are to be programmed receive the base current. In such case, the base current could be increased to the point where it provides aid to the programming by providing collector current that is significant in relation to the current required for programming. This could be used to further increase the benefits described previously. For example, the gate voltage and the voltage applied to the fuse may be reduced, even perhaps to normal logic levels so that no increase is required.

By now it should be appreciated that there has been provided a method comprising providing an array of memory cells and providing a signal terminal. The memory cells are arranged in a plurality of columns and rows. Each of the memory cells comprises a programmable fuse connected to a predetermined bit line and in series with a select transistor, the select transistor comprising a first current electrode connected to a reference voltage terminal, a control electrode connected to a predetermined word line and a second current electrode connected to the programmable fuse. The select transistor further comprises a semiconductor body in which the first current electrode and the second current electrode are located and separated by a channel. The signal terminal is connected to the semiconductor body for receiving an input signal to forward bias the channel to the first current electrode during programming of the programmable fuse to increase a programming current of the programmable fuse. The method may further comprise coupling row circuitry and column circuitry to the array of memory cells, the column circuitry providing a programming voltage to each of a plurality of bit lines and selecting a predetermined column in which an accessed memory cell is connected to, the row circuitry selecting a single row of cells which in combination with the selected predetermined column determines the accessed memory cell, the accessed memory cell forming a path to create the programming current and providing program control circuitry for providing the input signal to the semiconductor body of each select transistor only during a program operation of the array of memory cells. The method may further comprise implementing the select transistor in each of the memory cells as an N-channel metal oxide semiconductor transistor comprising a source as the first current electrode, a gate as the control electrode and a drain as the second current electrode and using a base of a parasitic bipolar transistor formed by the semiconductor body and the source and drain as the signal terminal to receive the input signal. The method may further comprise providing a switchable input current as the input signal. The method may further comprise providing a switchable input voltage as the input signal, the switchable input voltage having a value that increases the programming current and enables a reduction in physical size of the select transistor from a first size to a second size. The method may further comprise providing a switchable input voltage as the input signal, the switchable input voltage having a value that increases the programming current and enables a reduction in magnitude of programming voltage from a first value to a second value to further prevent accidental programming of memory cells connected to the selected predetermined column and unselected rows.

There is also described is a method comprising providing an electrically programmable fuse and providing a select transistor. The electrically programmable fuse has one of two possible impedance states in response to a programming current. The electrically programmable fuse has a first terminal for receiving a programming voltage and having a second terminal. The select transistor has a first current electrode connected to the second terminal of the electrically programmable fuse, a control electrode for receiving a select signal, a second current electrode connected to a reference voltage terminal, and a body terminal connected to a transistor body in which the first current electrode and the second current electrode are positioned and separated by a channel. The body terminal is provided to receive a switchable bias signal to forward bias the channel to the second current electrode to increase a programming current of the electrically programmable fuse. The method may further comprise implementing the select transistor as an N-channel metal oxide semiconductor transistor comprising a drain as the first current electrode, a gate as the control electrode, and a source as the second current electrode and using a base of a parasitic bipolar transistor formed by the transistor body and the source and drain as the body terminal. The method may further comprise providing a switchable input voltage as the switchable bias signal, the switchable input voltage having a value that increases the programming current and enables a reduction in magnitude of programming voltage from a first value to a second value to further prevent accidental programming of memory cells connected to the selected predetermined column and unselected rows. The method may further comprise providing an array of memory cells in rows and columns, each memory cell in the array of memory cells comprising an electrically programmable fuse and a select transistor that are connected as previous described for the method, coupling row circuitry and column circuitry to the array of memory cells, the column circuitry providing a programming voltage to at least one of a plurality of bit lines thereby selecting a corresponding column to which accessed memory cells may be connected, the row circuitry selecting a row of cells which in combination with the selected corresponding column determines the accessed memory cell, the accessed memory cell forming a path to create the programming current, and providing program control circuitry for providing the switchable bias signal to the transistor body of the select transistor only during a program operation of the array of memory cells. The method may further comprise providing a switchable input voltage as the switchable bias signal, the switchable input voltage having a value that increases the programming current and enables a reduction in magnitude of programming voltage from a first value to a second value to further prevent accidental programming of memory cells connected to the selected predetermined column and unselected rows. The method may further comprise providing a switchable input current as the switchable bias signal. The method may further comprise providing a switchable input voltage as the switchable bias signal, the switchable input voltage having a value that increases the programming current and enables a reduction in physical size of the select transistor from a first size to a second size.

Also described is a method comprising providing an electrically programmable fuse having a first terminal connected to a select line for receiving a select signal, and having a second terminal and coupling an N-channel metal oxide semiconductor (MOS) transistor to the second terminal of the electrically programmable fuse, the N-channel metal oxide semiconductor transistor having a drain, a gate, a source connected to a reference voltage terminal, the N-channel metal oxide semiconductor having a parasitic bipolar transistor comprising an emitter formed by the source, a collector formed by the drain, and a base formed by a transistor body of the N-channel metal oxide semiconductor transistor for receiving a switching body bias signal to selectively increase programming current conducted by the electrically programmable fuse when the electrically programmable fuse is being programmed. The method may further comprise forming an array of columns and rows of electrically programmable cells, each electrically programmable cell comprising an electrically programmable fuse and an N-channel metal oxide semiconductor transistor as recited in claim 14, wherein selectively increasing programming current in a selected electrically programmable cell reduces accidental programming of electrically programmable cells connected to a selected predetermined column and unselected rows. The method may further comprise coupling row circuitry and column circuitry to the array of columns and rows of electrically programmable cells, the column circuitry providing a programming voltage to at least one of a plurality of bit lines thereby selecting a predetermined column to which accessed electrically programmable cells may be connected to, the row circuitry selecting a row of electrically programmable cells which in combination with the selected predetermined column determines the accessed electrically programmable cell, the accessed electrically programmable cell forming a path to create the programming current, and providing program control circuitry for providing the switching body bias signal to the transistor body of each N-channel metal oxide semiconductor (MOS) transistor only during a program operation of the array of electrically programmable cells. The method may further comprise providing a switchable input current as the switching body bias signal. The method may further comprise providing a switchable input voltage as the switching body bias signal, the switchable input voltage having a value that increases the programming current and enables a reduction in physical size of the N-channel MOS transistor from a first size to a second size. The method may further comprise providing a switchable input voltage as the switching body bias signal, the switchable input voltage having a value that increases the programming current and enables a reduction in magnitude of programming voltage from a first value to a second value to further prevent accidental programming of electrically programmable cells connected to the selected predetermined column and unselected rows. The method may further comprise using a voltage of substantially 0.7 volt as the switching body bias signal to increase the programming current conducted by the electrically programmable fuse when in a program mode of operation.

Although the invention is described herein with reference to specific embodiments, various modifications and changes can be made without departing from the scope of the present invention as set forth in the claims below. For example, it may advantageous to use P channel transistors instead of N channel transistors with resulting parasitic transistor being a PNP transistor. The body bias would thus be altered to accommodate that situation rather than the described N channel transistor situation. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
providing an array of memory cells arranged in a plurality of columns and rows, each of the memory cells comprising a programmable fuse connected to a predetermined bit line and in series with a select transistor, the select transistor comprising a first current electrode connected to a reference voltage terminal, a control electrode connected to a predetermined word line and a second current electrode connected to the programmable fuse, the select transistor further comprising a semiconductor body in which the first current electrode and the second current electrode are located and separated by a channel;
selecting a memory cell to identify a selected memory cell from the array of memory cells for programming; and
in response to the selecting, providing a current to the semiconductor body of the select transistor of the selected memory cell to forward bias the channel to the first current electrode during programming of the programmable fuse of the selected memory cell to increase a programming current through select transistor and programmable fuse of the selected memory cell to result in programming of the selected memory cell.

2. The method of claim 1 further comprising:
coupling row circuitry and column circuitry to the array of memory cells, the column circuitry providing a programming voltage to each of a plurality of bit lines and selecting a predetermined column in which an accessed memory cell is connected to, the row circuitry selecting a single row of cells which in combination with the selected predetermined column determines the selected memory cell, the accessed memory cell forming a path to create the programming current; and
providing program control circuitry for providing the input signal to the semiconductor body of each select transistor only during a program operation of the array of memory cells.

3. The method of claim 2 further comprising:
implementing the select transistor in each of the memory cells as an N-channel metal oxide semiconductor transistor comprising a source as the first current electrode, a gate as the control electrode and a drain as the second current electrode; and
using a base of a parasitic bipolar transistor formed by the semiconductor body and the source and drain as the signal terminal to receive the input signal.

4. The method of claim 3 further comprising:
providing a switchable input current as the input signal.

5. The method of claim 3 further comprising:
providing a switchable input voltage as the input signal, the switchable input voltage having a value that increases the programming current and enables a reduction in physical size of the select transistor from a first size to a second size.

6. The method of claim 3 further comprising:
providing a switchable input voltage as the input signal, the switchable input voltage having a value that increases the programming current and enables a reduction in magnitude of programming voltage from a first value to a second value to further prevent accidental programming of memory cells connected to the selected predetermined column and unselected rows.

7. A method comprising:
providing an electrically programmable fuse having one of two possible impedance states in response to a programming current, the electrically programmable fuse having a first terminal for receiving a programming voltage and having a second terminal;
providing a select transistor having a first current electrode connected to the second terminal of the electrically programmable fuse, a control electrode for receiving a select signal, a second current electrode connected to a reference voltage terminal, and a body terminal connected to a transistor body in which the first current electrode and the second current electrode are positioned and separated by a channel, the body terminal provided to receive a switchable bias signal to forward bias the channel to the second current electrode to increase a programming current of the electrically programmable fuse;

applying a first set of signals to the select transistor when the electrically programmable fuse is selected for being programmed and a second set of signals to the select transistor when the electrically programmable fuse is deselected for being programmed;

asserting the switchable bias signal during a time that the first set of signals are being applied to the select transistor; and de-asserting the switchable bias signal when the second set of signals are applied to the select transistor.

8. The method of claim 7 further comprising:

implementing the select transistor as an N-channel metal oxide semiconductor transistor comprising a drain as the first current electrode, a gate as the control electrode, and a source as the second current electrode; and using a base of a parasitic bipolar transistor formed by the transistor body and the source and drain as the body terminal.

9. The method of claim 7 further comprising:

providing a switchable input voltage as the switchable bias signal, the switchable input voltage having a value that increases the programming current and enables a reduction in magnitude of programming voltage from a first value to a second value to further prevent accidental programming of memory cells connected to the selected predetermined column and unselected rows.

10. The method of claim 7 further comprising:

providing an array of memory cells in rows and columns, each memory cell in the array of memory cells comprising an electrically programmable fuse and a select transistor that are connected as recited in claim 7;

coupling row circuitry and column circuitry to the array of memory cells, the column circuitry providing a programming voltage to at least one of a plurality of bit lines thereby selecting a corresponding column to which accessed memory cells may be connected, the row circuitry selecting a row of cells which in combination with the selected corresponding column determines the accessed memory cell, the accessed memory cell forming a path to create the programming current; and providing program control circuitry for providing the switchable bias signal to the transistor body of the select transistor only during a program operation of the array of memory cells.

11. The method of claim 10 further comprising:

providing a switchable input voltage as the switchable bias signal, the switchable input voltage having a value that increases the programming current and enables a reduction in magnitude of programming voltage from a first value to a second value to further prevent accidental programming of memory cells connected to the selected predetermined column and unselected rows.

12. The method of claim 7 further comprising:

providing a switchable input current as the switchable bias signal.

13. The method of claim 7 further comprising:

providing a switchable input voltage as the switchable bias signal, the switchable input voltage having a value that increases the programming current and enables a reduction in physical size of the select transistor from a first size to a second size.

14. A method comprising:

providing an electrically programmable fuse having a first terminal connected to a select line for receiving a select signal, and having a second terminal; and coupling an N-channel metal oxide semiconductor (MOS) transistor to the second terminal of the electrically programmable fuse, the N-channel metal oxide semiconductor transistor having a drain, a gate, a source connected to a reference voltage terminal, the N-channel metal oxide semiconductor having a parasitic bipolar transistor comprising an emitter formed by the source, a collector formed by the drain, and a base formed by a transistor body of the N-channel metal oxide semiconductor transistor for receiving a switching body bias signal to selectively increase programming current conducted by the electrically programmable fuse when the electrically programmable fuse is being programmed;

applying a first set of signals to the N-channel MOS transistor when the electrically programmable fuse is selected for being programmed and a second set of signals to the N-channel MOS transistor when the electrically programmable fuse is deselected for being programmed;

asserting the switching body bias signal during a time that the first set of signals are being applied to the N-channel MOS transistor; and de-asserting the switchable bias signal when the second set of signals are applied to the select transistor.

15. The method of claim 14 further comprising:

forming an array of columns and rows of electrically programmable cells, each electrically programmable cell comprising an electrically programmable fuse and an N-channel metal oxide semiconductor transistor as recited in claim 14, wherein selectively increasing programming current in a selected electrically programmable cell reduces accidental programming of electrically programmable cells connected to a selected predetermined column and unselected rows.

16. The method of claim 14 further comprising:

using a voltage of substantially 0.7 volt as the switching body bias signal to increase the programming current conducted by the electrically programmable fuse when in a program mode of operation.

* * * * *